United States Patent
Kim

(10) Patent No.: US 9,929,312 B2
(45) Date of Patent: Mar. 27, 2018

(54) LIGHT EMITTING DEVICE

(71) Applicant: LG INNOTEK CO., LTD., Seoul (KR)

(72) Inventor: Chong Cook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/317,672

(22) PCT Filed: Jun. 12, 2015

(86) PCT No.: PCT/KR2015/005933
§ 371 (c)(1),
(2) Date: Dec. 9, 2016

(87) PCT Pub. No.: WO2015/190865
PCT Pub. Date: Dec. 17, 2015

(65) Prior Publication Data
US 2017/0117439 A1    Apr. 27, 2017

(30) Foreign Application Priority Data
Jun. 12, 2014 (KR) .................. 10-2014-0071459

(51) Int. Cl.
*H01L 33/22* (2010.01)
*H01L 33/38* (2010.01)
*H01L 33/42* (2010.01)

(52) U.S. Cl.
CPC ............ *H01L 33/22* (2013.01); *H01L 33/382* (2013.01); *H01L 33/42* (2013.01);
(Continued)

(58) Field of Classification Search
CPC .................. H01L 33/58; H01L 2933/0058
See application file for complete search history.

(56) References Cited

U.S. PATENT DOCUMENTS

| 8,952,401 B2 * | 2/2015 | Sugiyama ......... H01L 21/02381 257/103 |
| 2004/0016936 A1 * | 1/2004 | Tanaka .................. H01L 33/20 257/98 |

(Continued)

FOREIGN PATENT DOCUMENTS

| JP | 2007-013045 A | 1/2007 |
| JP | 2009-252826 A | 10/2009 |

(Continued)

*Primary Examiner* — Roy Potter
*Assistant Examiner* — Paul Patton
(74) *Attorney, Agent, or Firm* — Birch, Stewart, Kolasch & Birch, LLP

(57) ABSTRACT

An embodiment provides a light-emitting element comprising: a substrate; a light-emitting structure, which is arranged on the substrate, and which comprises a first conductive semiconductor layer, an active layer, and a second conductive semiconductor layer; a light-transmissive conductive layer arranged on the second conductive semiconductor layer; and first and second electrodes electrically connected to the first and second conductive semiconductor layers, respectively, wherein the light-transmissive conductive layer has corrugated portions formed on a first surface thereof, which is directed to the second conductive semiconductor layer, and the density of the corrugated portions in the peripheral area of the light-transmissive conductive layer is larger than the density of the corrugated portions in the central area of the light-transmissive conductive layer.

18 Claims, 11 Drawing Sheets

(52) U.S. Cl.
CPC ............. *H01L 2224/48091* (2013.01); *H01L 2224/49107* (2013.01); *H01L 2924/181* (2013.01)

(56) References Cited

U.S. PATENT DOCUMENTS

2013/0330853 A1   12/2013   Tischler
2015/0084537 A1    3/2015   Choi et al.

FOREIGN PATENT DOCUMENTS

| | | |
|---|---|---|
| JP | 2010-287761 A | 12/2010 |
| KR | 10-2005-0122600 A | 12/2005 |
| KR | 10-2006-0112064 A | 10/2006 |
| KR | 10-2010-0054756 A | 5/2010 |
| KR | 10-2010-0083111 A | 7/2010 |

* cited by examiner

Center   Edge

LIGHT EMITTING DEVICE

CROSS REFERENCE TO RELATED APPLICATIONS

This application is the National Phase of PCT International Application No. PCT/KR2015/005933, filed on Jun. 12, 2015, which claims priority under 35 U.S.C. 119(a) to Patent Application No. 10-2014-0071459, filed in the Republic of Korea on Jun. 12, 2014, all of which are hereby expressly incorporated by reference into the present application.

TECHNICAL FIELD

Embodiments relate to a light emitting device and a light emitting device package including the same, and more particularly to a light emitting device having enhanced light extraction efficiency.

BACKGROUND ART

Group III-V compound semiconductors such as GaN and AlGaN are widely used in optoelectronics and for electronic devices by virtue of many advantages thereof, for example, wide and easy-adjustable band gap energy.

In particular, light emitting devices, such as light emitting diodes (LEDs) and laser diodes, which use a Group III-V or Group II-VI compound semiconductor material, may render various colors such as red, green, blue, and ultraviolet by virtue of development of thin film growth technologies and device materials. It may also be possible to produce white light at high efficiency using fluorescent materials or through color mixing. Further, light emitting devices have advantages, such as low power consumption, semi-permanent lifespan, fast response time, safety, and environmental friendliness as compared to conventional light sources, such as fluorescent lamps and incandescent lamps.

Therefore, these light emitting devices are increasingly applied to transmission modules of optical communication units, light emitting diode backlights as a replacement for cold cathode fluorescent lamps (CCFLs) constituting backlights of liquid crystal display (LCD) devices, and lighting apparatuses using white light emitting diodes as a replacement for fluorescent lamps or incandescent lamps, headlights for vehicles and traffic lights.

In a conventional light emitting device, a light emitting structure including an undoped semiconductor layer (un-GaN), a first conductivity type semiconductor layer (n-GaN) an active layer (multi-quantum well (MQW)) and a second conductivity type semiconductor layer (p-GaN) is formed on a substrate made of sapphire or the like. First and second electrodes may be disposed on the first conductivity type semiconductor layer and second conductivity type semiconductor layer, respectively.

The light emitting device emits light having energy determined by an intrinsic energy band of the material of the active layer when electrons injected into the active layer via the first conductivity type semiconductor layer recombine with holes injected into the active layer via the second conductivity type semiconductor layer. Light emitted from the active layer may vary in accordance with the composition of the material of the active layer. The light may be blue light, ultraviolet (UV) light, deep UV light or light of other wavelength ranges.

FIG. 1 is a view illustrating a conventional light emitting device.

The light emitting device, which is designated by reference numeral "100", includes a substrate 110, a light emitting structure formed on the substrate 110 while including a first conductivity type semiconductor layer 122, an active layer 124 and a second conductivity type semiconductor layer 126, a transmissive conductive layer 150 formed on the light emitting structure 120, a first electrode 180, and a second electrode 185.

When the second conductivity type semiconductor layer 126 is a p-GaN layer, inferior current spreading effects may be exhibited. For this reason, the transmissive conductive layer 150 is disposed on the second conductivity type semiconductor layer 126 so as to receive current from the second electrode 185.

In this case, however, light emitted from the light emitting structure 120 may be partially absorbed by the transmissive conductive layer 150. Furthermore, there may be a problem in that the light emitting device 100 has a narrow orientation angle.

DISCLOSURE

Technical Problem

Embodiments are intended to achieve an enhancement in light extraction efficiency and widening of an orientation angle.

Technical Solution

In an embodiment, there is provided a light emitting device including a substrate, a light emitting structure disposed on the substrate, the light emitting structure including a first conductivity type semiconductor layer, an active layer, and a second conductivity type semiconductor layer, a transmissive conductive layer disposed on the second conductivity type semiconductor layer, and first and second electrodes respectively electrically connected to the first conductivity type semiconductor layer and the second conductivity type semiconductor layer, wherein the transmissive conductive layer is formed with concave and convex portions at a surface thereof directed to the second conductivity type semiconductor layer, and the concave and convex portions have a greater density in an edge region of the transmissive conductive layer than in a central region of the transmissive conductive layer.

The concave and convex portions may have greater sizes in the edge region of the transmissive conductive layer than in the central region of the transmissive conductive layer.

The concave and convex portions may have sizes gradually increasing in a direction from the central region of the transmissive conductive layer to the edge region of the transmissive conductive layer.

The numbers of the concave and convex portions per unit area may be greater in the edge region of the transmissive conductive layer than in the central region of the transmissive conductive layer.

The numbers of the concave and convex portions per unit area may gradually increase in a direction from the central region of the transmissive conductive layer to the edge region of the transmissive conductive layer.

The distance between the concave portions and the distance between the convex portions may be smaller in the edge region of the transmissive conductive layer than in the central region of the transmissive conductive layer.

The distance between the concave portions and the distance between the convex portions may gradually decrease in a direction from the central region of the transmissive conductive layer to the edge region of the transmissive conductive layer.

The transmissive conductive layer may be made of indium tin oxide (ITO).

The second conductivity type semiconductor layer may have a surface patterned to have portions having shapes opposite to shapes of the concave and convex portions of the transmissive conductive layer.

In another embodiment, there is provided a light emitting device including a substrate, a light emitting structure disposed on the substrate, the light emitting structure comprising a first conductivity type semiconductor layer, an active layer, and a second conductivity type semiconductor layer, a transmissive conductive layer disposed on the second conductivity type semiconductor layer, and first and second electrodes respectively electrically connected to the first conductivity type semiconductor layer and the second conductivity type semiconductor layer, wherein the transmissive conductive layer is formed with concave and convex portions at a surface thereof opposing the second conductivity type semiconductor layer, and the concave and convex portions have a greater density in an edge region of the transmissive conductive layer than in a central region of the transmissive conductive layer.

The concave and convex portions may have greater sizes in the edge region of the transmissive conductive layer than in the central region of the transmissive conductive layer.

The concave and convex portions may have sizes gradually increasing in a direction from the central region of the transmissive conductive layer to the edge region of the transmissive conductive layer.

The numbers of the concave and convex portions per unit area may be greater in the edge region of the transmissive conductive layer than in the central region of the transmissive conductive layer.

The numbers of the concave and convex portions per unit area may gradually increase in a direction from the central region of the transmissive conductive layer to the edge region of the transmissive conductive layer.

The distance between the concave portions and the distance between the convex portions may be smaller in the edge region of the transmissive conductive layer than in the central region of the transmissive conductive layer.

The distance between the concave portions and the distance between the convex portions may gradually decrease in a direction from the central region of the transmissive conductive layer to the edge region of the transmissive conductive layer.

The transmissive conductive layer may be made of indium tin oxide (ITO).

The second conductivity type semiconductor layer may be disposed on the transmissive conductive layer. The second conductivity type semiconductor layer may have a surface patterned to have portions having shapes opposite to shapes of the concave and convex portions of the transmissive conductive layer.

Cross-sections of the concave and convex portions in a direction parallel to a light emitting surface of the active layer may have a circular or polygonal shape. In another embodiment, there is provided a light emitting device including a substrate, a light emitting structure disposed on the substrate, the light emitting structure comprising a first conductivity type semiconductor layer, an active layer, and a second conductivity type semiconductor layer, and a transmissive conductive layer disposed on the second conductivity type semiconductor layer, wherein the transmissive conductive layer has concave and convex portions disposed on a first surface directed to the second conductivity type semiconductor layer and a second surface opposing the first surface respectively, and wherein a density of the concave and convex portions on the first surface is different from a density of the concave and convex portions on the second surface.

Advantageous Effects

In the light emitting device according to each embodiment and a light emitting device package including the same, the uneven structure formed at the surface of the substrate has a higher density or a greater convex portion size in the edge region of the transmissive conductive layer. Accordingly, light emitted from the light emitting structure is refracted at a higher refraction angle in the edge region of the transmissive conductive layer. As a result, widening of an orientation angle may be achieved. In addition, if necessary, the uneven structure formed at the surface of the transmissive conductive layer may be present only in the central region of the transmissive conductive layer, or may have an increased density in the central region of the transmissive conductive layer. In this case, accordingly, light emitted from the light emitting structure is refracted at a higher refraction angle in the central region of the transmissive conductive layer. As a result, although narrowing of an orientation angle may occur, an enhancement in light output power may be achieved.

BEST MODE

Hereinafter, embodiments will be described with reference to the annexed drawings.

It will be understood that when an element is referred to as being "on" or "under" another element, it can be directly on or under another element or can be indirectly formed such that an intervening element is also present. When an element is referred to as being "on" or "under", "under the element" as well as "on the element" can be included based on the element.

FIGS. 2A to 2F are sectional views illustrating light emitting devices according to embodiments, respectively.

Figure 1:
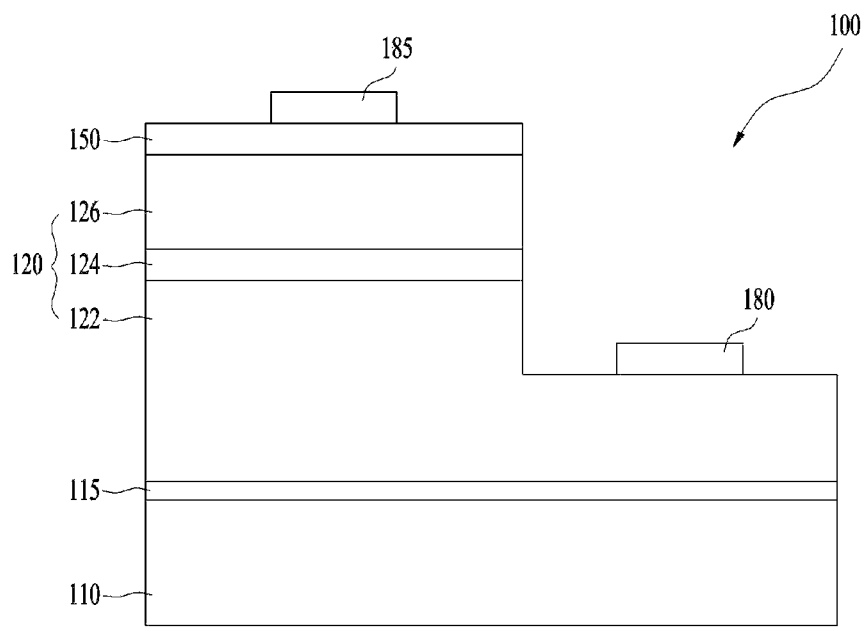
FIG. 1 is a view illustrating a conventional light emitting device.
Figure 2A:
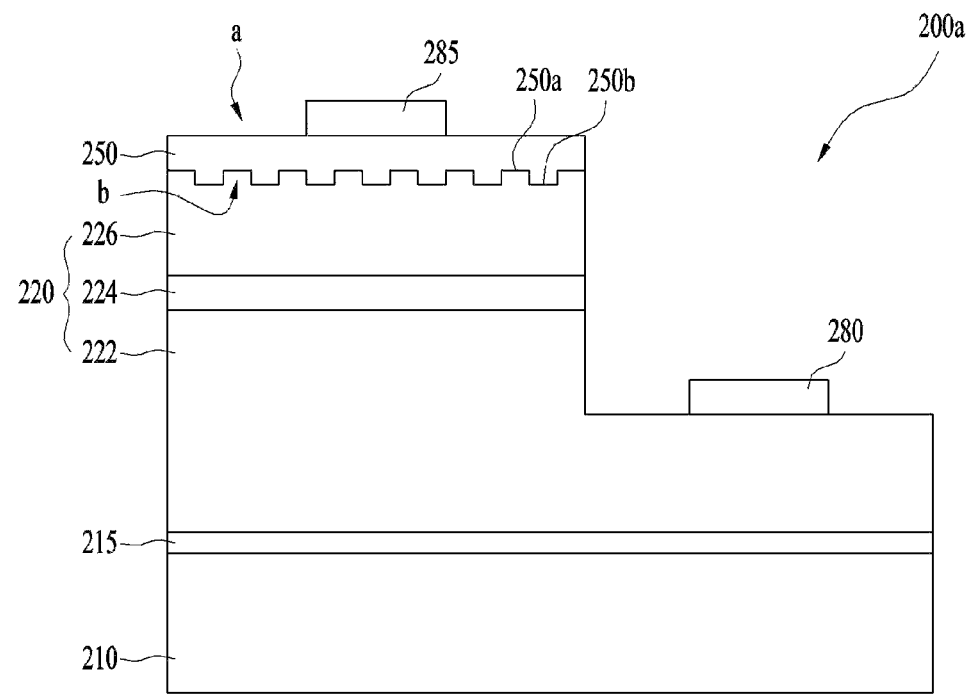
FIGS. 2A to 2F are sectional views illustrating light emitting devices according to embodiments, respectively.

The light emitting device illustrated in FIG. 2A, namely, a light emitting device 200a, may include a substrate 210, a light emitting structure 220 disposed on the substrate 210 while including a first conductivity type semiconductor layer 222, an active layer 224 and a second conductivity type semiconductor layer 226, a transmissive conductive layer 250 disposed on the second conductivity type semiconductor layer 226, and first and second electrodes 280 and 285 respectively disposed on the first conductivity type semiconductor layer 222 and second conductivity type semiconductor layer 226.

The substrate 210 may be formed using a material suitable for growth of a semiconductor material or a carrier wafer. The substrate 210 may also be made of a material having excellent thermal conductivity. The substrate 210 may be a conductive substrate or an insulating substrate. For example, the substrate 210 may be made of at least one of sapphire ($Al_2O_3$), $SiO_2$, SiC, Si, GaAs, GaN, ZnO, GaP, InP, Ge, and $Ga_2O_3$.

When the substrate 210 is made of sapphire, and the light emitting structure 220, which includes GaN or AlGaN, is disposed on the substrate 210, dislocations, melt-back, cracks, pits, or inferior surface morphology deteriorating crystallinity may be generated due to very high lattice mismatch and very high thermal expansion coefficient difference between GaN or AlGaN and sapphire. To this end, a buffer layer 215 may be formed using AlN or the like, or an undoped semiconductor layer (not shown) may be formed.

An uneven structure may be formed on a surface of the substrate 210, to refract light advancing to the substrate 210 after being emitted from the light emitting structure 220.

The first conductivity type semiconductor layer 222 may be made of a Group III-V or Group II-VI compound semiconductor. The first conductivity type semiconductor layer 222 may be doped with a first conductivity type dopant. The first conductivity type semiconductor layer 222 may include a semiconductor material having a formula of $Al_xIn_yGa_{1-x-y}N$ ($0 \leq x \leq 1$, $0 \leq y \leq 1$, and $0 \leq x+y \leq 1$). The first conductivity type semiconductor layer 222 may be made of at least one of AlGaN, GaN, InAlGaN, AlGaAs, GaP, GaAs, GaAsP, and AlGaInP.

When the first conductivity type semiconductor layer 222 is an n-type semiconductor layer, the first conductivity type dopant is an n-type dopant such as Si, Ge, Sn, Se, or Te. The first conductivity type semiconductor layer 222 may be formed to have a single layer structure or a multilayer structure, but the present disclosure is not limited thereto.

The active layer 224 is disposed on the first conductivity type semiconductor layer 222. The active layer 224 may include one of a single well structure (double hetero structure), a multi-well structure, a single quantum well structure, a multi-quantum well (MQW) structure, a quantum dot structure, and a quantum wire structure.

The active layer 224 may have well and barrier layers, using compound semiconductor materials of Ground III-V elements. For example, the active layer 224 may have a layer pair structure made of at least one of AlGaN/AlGaN, InGaN/GaN, InGaN/InGaN, AlGaN/GaN, InAlGaN/GaN, GaAs (InGaAs)/AlGaAs, and GaP(InGaP)/AlGaP, but the present disclosure is not limited thereto. The well layer may be made of a material having a lower band gap than the barrier layer.

The second conductivity type semiconductor layer 226 may be formed over the active layer 224, using a semiconductor compound. The second conductivity type semiconductor layer 226 may be made of a Group III-V compound semiconductor, and may be doped with a second conductivity type dopant. The second conductivity type semiconductor layer 226 may be made of a semiconductor material having a formula of, for example, $In_xAl_yGa_{1-x-y}N$ ($0 \leq x \leq 1$, $0 \leq y \leq 1$, $0 \leq x+y \leq 1$). The second conductivity type semiconductor layer 226 may be made of at least one of AlGaN, GaN, AlInN, AlGaAs, GaP, GaAs, GaAsP, and AlGaInP. For example, the second conductivity type semiconductor layer 226 may be made of $Al_xGa_{1-x}N$.

The second conductivity type semiconductor layer 226 may be doped with a second conductivity type dopant and, as such, may be a second conductivity type semiconductor layer. When the second conductivity type semiconductor layer 226 is a p-type semiconductor layer, the second conductivity type dopant is a p-type dopant such as Mg, Zn, Ca, Sr, or Ba. The second conductivity type semiconductor layer 226 may be formed to have a single layer structure or a multilayer structure, but the present disclosure is not limited thereto.

Although not shown, an electron blocking layer may be interposed between the active layer 224 and the second conductivity type semiconductor layer 226. The electron blocking layer may have a super-lattice structure. In this case, the super-lattice structure may be formed by alternately arranging, for example, an AlGaN layer doped with a second conductivity type dopant and a GaN layer having an aluminum content different from that of the AlGaN layer, to form a multilayer structure.

The second conductivity type semiconductor layer 226, the active layer 224, and the first conductivity type semiconductor layer 222 are mesa-etched in a partial region of the light emitting structure 220 in such a manner that etching is carried out from the second conductivity type semiconductor layer 226 to a portion of the first conductivity type semiconductor layer 222, thereby exposing a surface of the first conductivity type semiconductor layer 222.

The transmissive conductive layer 250 may be disposed on the second conductivity type semiconductor layer 226. The transmissive conductive layer 250 may be made of indium tin oxide (ITO). Since the second conductivity type semiconductor layer 226 has inferior current spreading characteristics, the transmissive conductive layer 250 may receive current from the second electrode 285.

When the surface of the transmissive conductive layer 250 contacting the second conductivity type semiconductor layer 226 is defined as a first surface b, and the surface of the transmissive conductive layer 250 opposing the first surface b is defined as a second surface a, the transmissive conductive layer 250 is formed with an uneven structure at the first surface b thereof toward the second conductivity type semiconductor layer 226 in this embodiment. In an embodiment illustrated in FIG. 2B, the transmissive conductive layer 250 is formed with an uneven structure at the second surface a thereof.

The uneven structure is formed by repeatedly arranging concave portions 250b and convex portions 250a. The concave portions 250b and convex portions 250a may be non-uniform in terms of size, shape, or arrangement.

Since the uneven structure is formed at the first surface b of the transmissive conductive layer 250 in this embodiment, an upper portion of the light emitting structure 220, namely, the second conductivity type semiconductor layer 226, may have an uneven surface due to the concave and convex portions formed at the transmissive conductive layer 250 in a region contacting the transmissive conductive layer 250. That is, the second conductivity type semiconductor layer 226 may have a surface patterned to have portions having shapes opposite to those of the concave and convex portions of the transmissive conductive layer 250.

The first electrode 280 and the second electrode 285 are disposed on the exposed surface of the first conductivity type semiconductor layer 222 and the second surface a of the transmissive conductive layer 250. Each of the first and second electrodes 280 and 285 may include at least one of Al, Ti, Cr, Ni, Cu, and Au, and may have a single layer structure or a multilayer structure. Each of the first and second electrodes 280 and 285 may be connected to a wire (not shown).

Although not shown, a passivation layer may be formed around the light emitting structure 220. The passivation layer may be made of an insulating material. In detail, the passivation layer may be made of oxide or nitride. In more detail, the passivation layer may be constituted by a silicon oxide ($SiO_2$) layer, an oxide nitride layer, or an aluminum oxide layer.

Figure 2B:
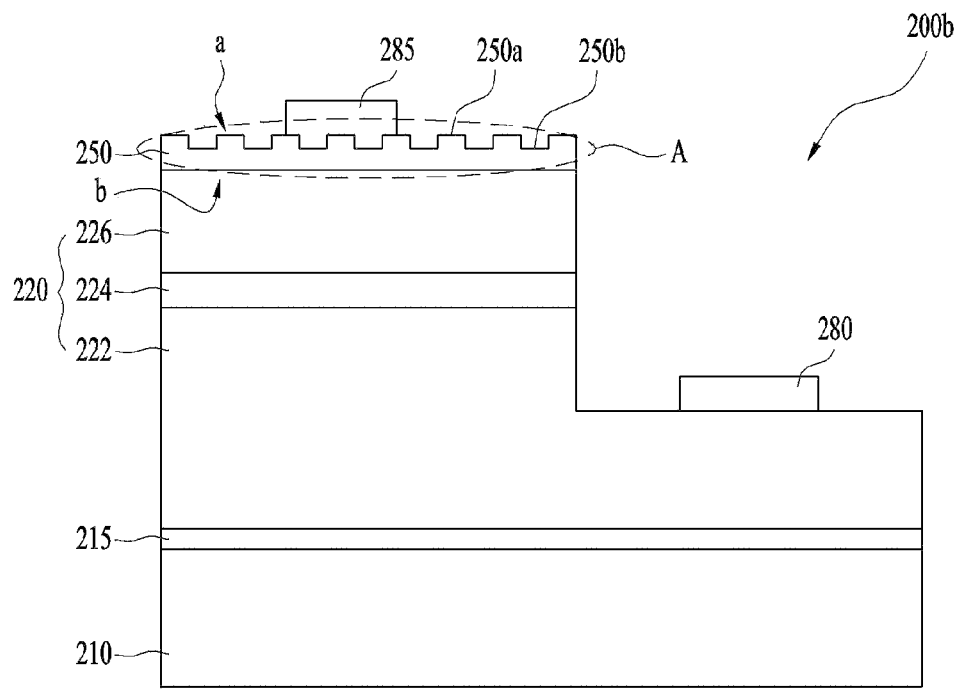

The light emitting device illustrated in FIG. 2B, namely, a light emitting device 200b, is identical to the light emitting device 200a of FIG. 2A, except that an uneven structure is formed at the second surface a of the transmissive conductive layer 250. In embodiments illustrated in FIGS. 2C to 2F, uneven structures are formed at both the first and second surfaces b and a of the transmissive conductive layer 250, respectively.

Figure 2C:
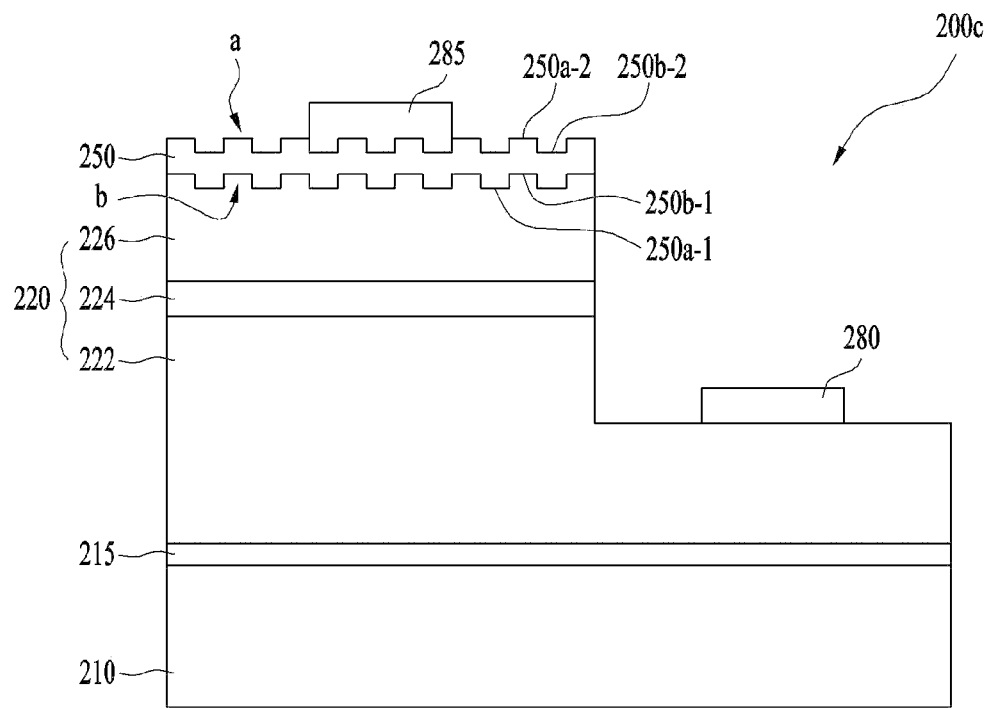

In a light emitting device 200c illustrated in FIG. 2C, concave portions 250b-1 and convex portions 250a-1 formed at the first surface b of the transmissive conductive layer 250 may have the same spacing and thickness as concave portions 250b-2 and convex portions 250a-2 formed at the second surface a of the transmissive conductive layer 250. The convex portions 250a-2 formed at the second surface a may be arranged on the concave portions 250b-1 formed at the first surface b, and concave portions 250b-2 formed at the second surface a may be arranged on the convex portions 250a-1 formed at the first surface b.

Figure 2D:
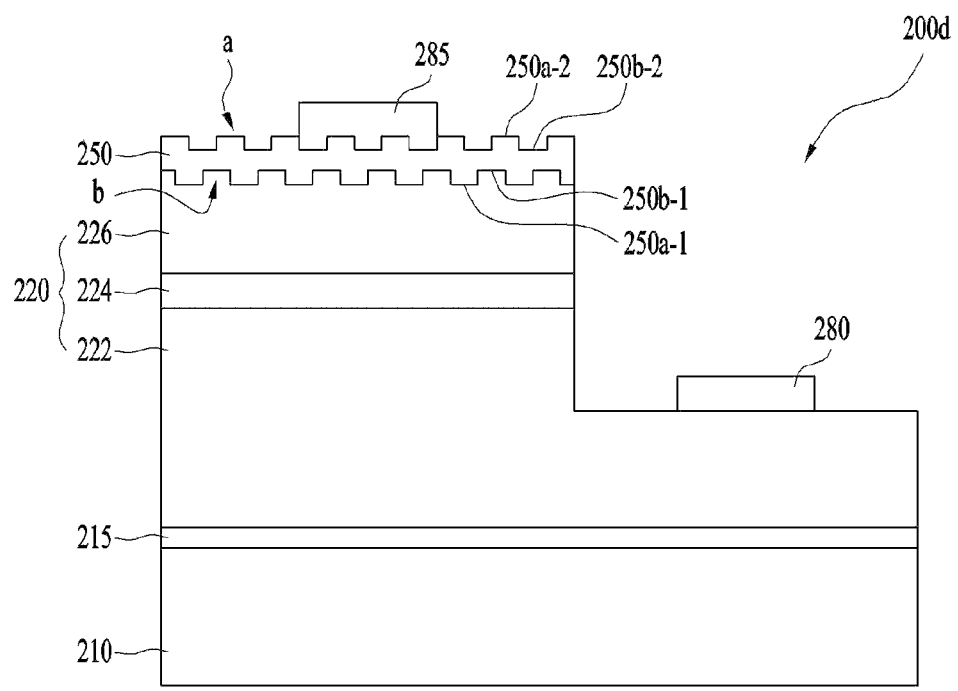

In a light emitting device 200d illustrated in FIG. 2D, concave portions 250b-1 and convex portions 250a-1 formed at the first surface b of the transmissive conductive layer 250 may have the same spacing and thickness as concave portions 250b-2 and convex portions 250a-2 formed at the second surface a of the transmissive conductive layer 250. However, the concave portions 250b-1 and convex portions 250a-1 formed at the first surface b of the transmissive conductive layer 250 may differ from the concave portions 250b-2 and convex portions 250a-2 formed at the second surface a of the transmissive conductive layer 250, in terms of relative positions.

The center between the concave and convex portions 250b-2 and 250a-2 formed at the second surface a may be arranged at the boundary between the concave and convex portions 250b-1 and 250a-1 formed at the first surface b.

Figure 2E:
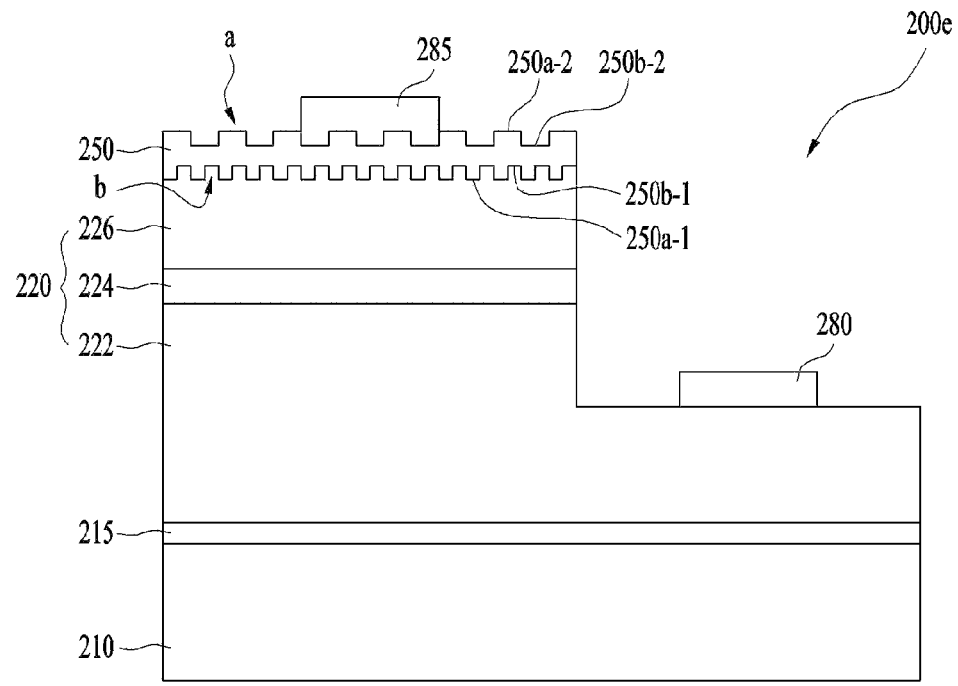

In a light emitting device 200e illustrated in FIG. 2E, concave portions 250b-2 and convex portions 250a-2 formed at the second surface a of the transmissive conductive layer 250 may have a width and a height greater than those of concave portions 250b-1 and convex portions 250a-1 formed at the first surface b of the transmissive conductive layer 250.

Figure 2F:
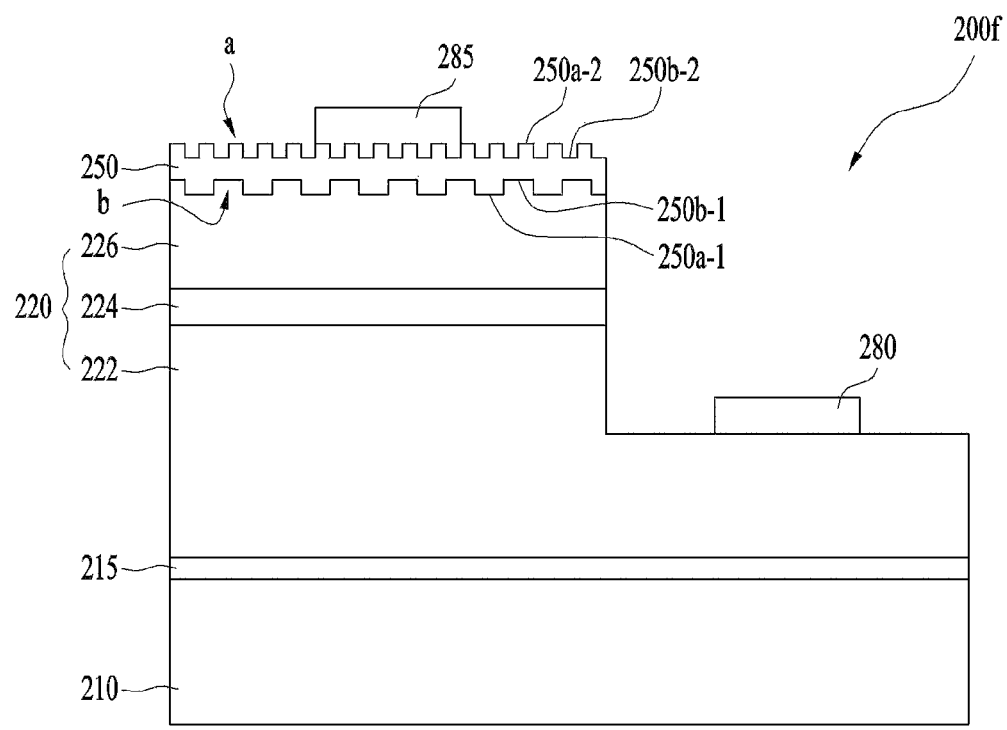

In a light emitting device 200f illustrated in FIG. 2F, concave portions 250b-2 and convex portions 250a-2 formed at the second surface a of the transmissive conductive layer 250 may have a width and a height smaller than those of concave portions 250b-1 and convex portions 250a-1 formed at the first surface b of the transmissive conductive layer 250.

In each embodiment, the second electrode 285 is arranged on the uneven structure of the transmissive conductive layer 250. In this case, the uneven structure may not be formed at the transmissive conductive layer 250 in a region contacting the second electrode 285.

In addition, in the uneven structure, which includes the concave portions 250b and convex portions 250a, the density or number of the concave portions 250b and convex portions 250a may be greater in an edge region of the transmissive conductive layer 250 than in a central region of the transmissive conductive layer 250.

In addition, the convex portions 250a are illustrated as having a circular column shape. However, the convex portions 250a may have shapes other than the illustrated shape, so long as the convex portions 250a protrude, as compared to the convex portions 250b.

In accordance with this structure, light emitted from the light emitting structure is refracted such that the refraction angle in the edge region of the transmissive conductive layer 250 is greater than the refraction angle in the central region of the transmissive conductive layer 250. As a result, spreading of light emitted from the light emitting device toward a peripheral side is increased and, as such, widening of an orientation angle may be achieved.

Figure 3A:
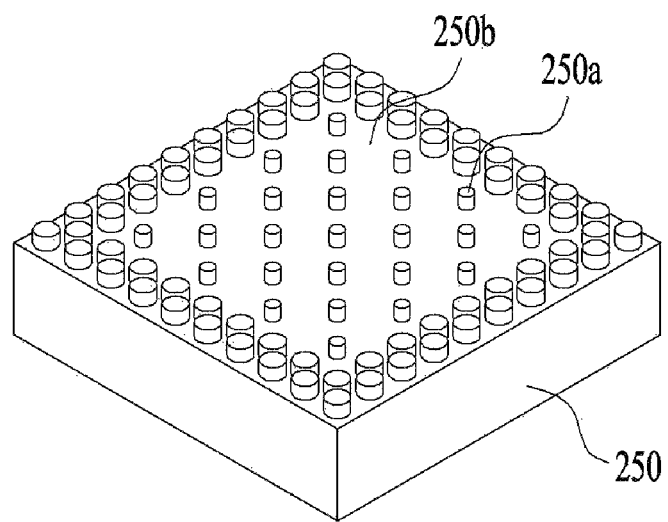
FIGS. 3A and 3B are views concretely illustrating a first embodiment of a region A of FIG. 2B.
Figure 3B:
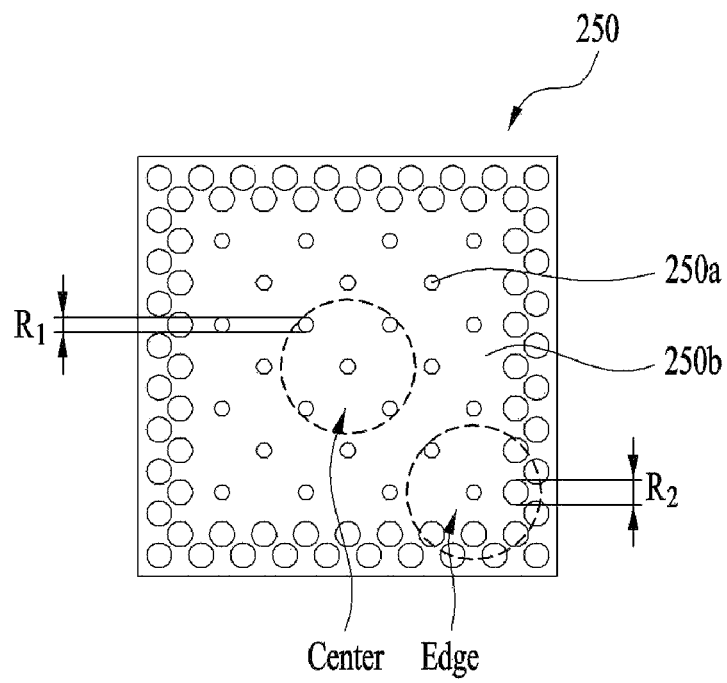

FIGS. 3A and 3B are views concretely illustrating a first embodiment of a region A of FIG. 2B.

In this embodiment, the convex portions 250a may have a greater size in the edge region of the transmissive conductive layer 250 than in the central region of the transmissive conductive layer 250. Here, the size of each convex portion 250a may be determined by the diameter of the convex portion 250a.

That is, the diameter of each convex portion 250a in the edge region of the transmissive conductive layer 250, namely, a diameter $R_2$, may be greater than the diameter of each convex portion 250a in the central region of the transmissive conductive layer 250, namely, a diameter $R_1$.

Figure 3C:
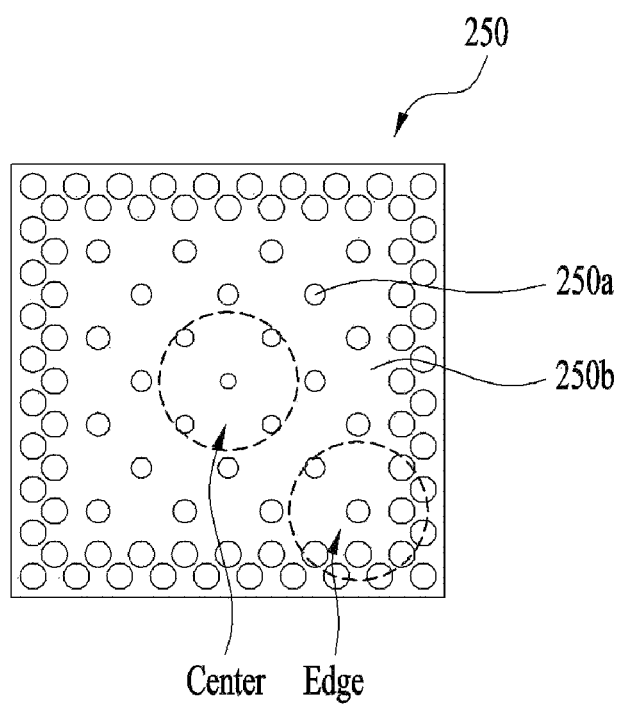
FIG. 3C is a view concretely illustrating a second embodiment of the region A of FIG. 2B, FIGS. 4A and 4B are views concretely illustrating a third embodiment of the region A of FIG. 2B.

FIG. 3C is a view concretely illustrating a second embodiment of the region A of FIG. 2B.

The uneven structure of the transmissive conductive layer 250 according to this embodiment is similar to that of the first embodiment, except that the size (diameter) of each convex portion 250b gradually increases in a direction from the central region of the transmissive conductive layer 250 to the edge region of the transmissive conductive layer 250.

Figure 4A:
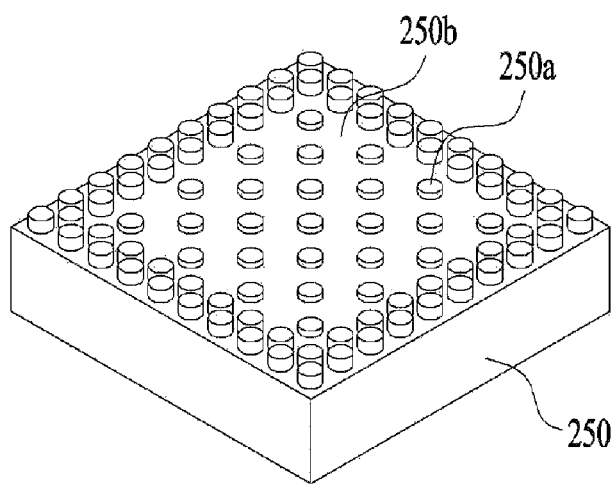
FIG. 4C is a view concretely illustrating a fourth embodiment of the region A of FIG. 2B, FIGS. 5A and 5B are views concretely illustrating a fifth embodiment of the region A of FIG. 2B.
Figure 4B:
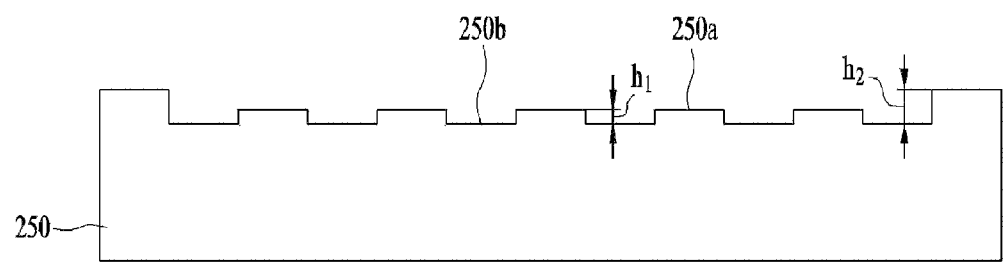

FIGS. 4A and 4B are views concretely illustrating a third embodiment of the region A of FIG. 2B.

FIG. 4A is a perspective view of the third embodiment, and FIG. 4B is a plan view of the third embodiment. In this embodiment, the convex portions 250a may have a greater size in the edge region of the transmissive conductive layer 250 than in the central region of the transmissive conductive layer 250. Here, the size of each convex portion 250a may be determined by the height of the convex portion 250a.

That is, the height of each convex portion 250a in the edge region of the transmissive conductive layer 250, namely, a height $h_2$, may be greater than the height of each convex portion 250a in the central region of the transmissive conductive layer 250, namely, a height $h_1$.

Figure 4C:
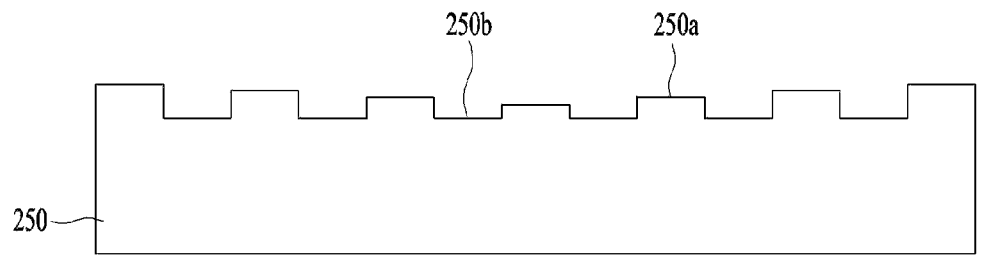

FIG. 4C is a view concretely illustrating a fourth embodiment of the region A of FIG. 2B.

The uneven structure of the transmissive conductive layer 250 according to this embodiment is similar to that of the third embodiment, except that the size (height) of each convex portion 250b gradually increases in a direction from the central region of the transmissive conductive layer 250 to the edge region of the transmissive conductive layer 250.

Figure 5A:
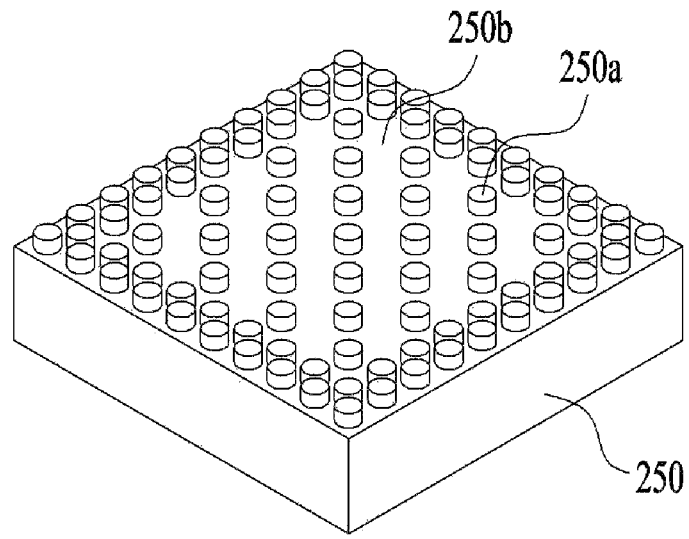
FIG. 5C is a view concretely illustrating a sixth embodiment of the region A of FIG. 2B.
Figure 5B:
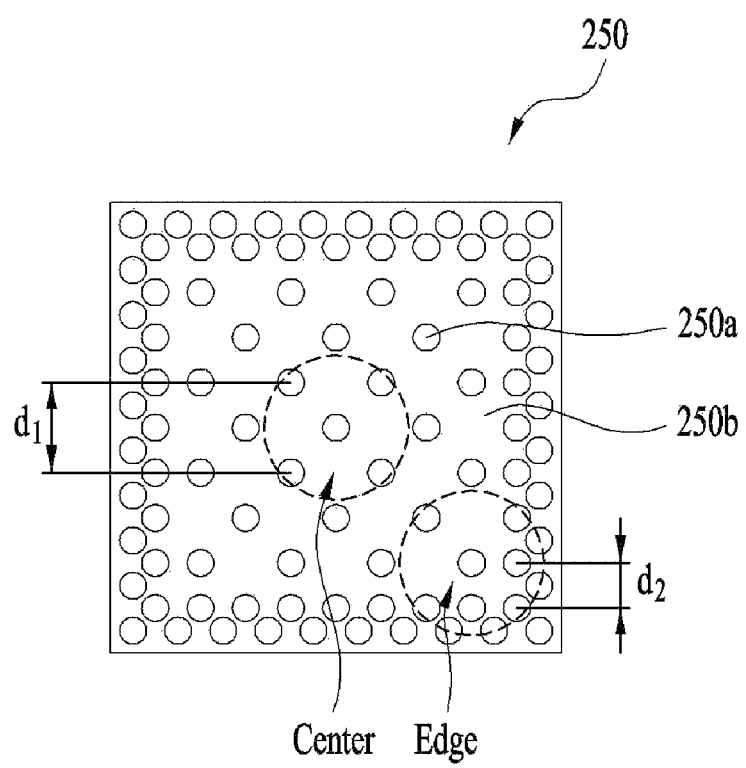

FIGS. 5A and 5B are views concretely illustrating a fifth embodiment of the region A of FIG. 2B.

FIG. 5A is a perspective view of the fifth embodiment, and FIG. 5B is a plan view of the fifth embodiment. As illustrated in FIGS. 5A and 5B, an uneven structure including concave portions 250b and convex portions 250a is formed at a surface of the transmissive conductive layer 250. In this case, the distance between the convex portions 250a may be smaller in the edge region of the transmissive conductive layer 250 than in the central region of the transmissive conductive layer 250.

That is, the distance between the convex portions 250a in the edge region of the transmissive conductive layer 250, namely, a distance $d_2$, may be smaller than the distance between the convex portions 250a in the central region of the transmissive conductive layer 250, namely, a distance $d_1$.

In accordance with this structure, light emitted from the light emitting structure is refracted at a higher refraction angle in the edge region of the transmissive conductive layer 250 where the uneven structure is densely formed. As a result, spreading of light emitted from the light emitting device toward a peripheral side is increased and, as such, widening of an orientation angle may be achieved.

Figure 5C:
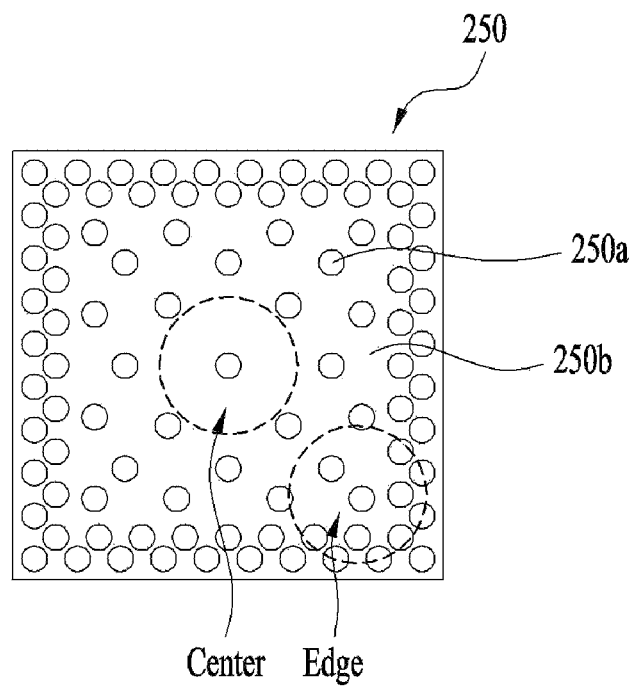

FIG. 5C is a view concretely illustrating a sixth embodiment of the region A of FIG. 2B.

The uneven structure of the transmissive conductive layer 250 according to this embodiment is similar to that of the fifth embodiment, except that the distance between the convex portions 250b gradually decreases in a direction from the central region of the transmissive conductive layer 250 to the edge region of the transmissive conductive layer 250.

Figure 6:
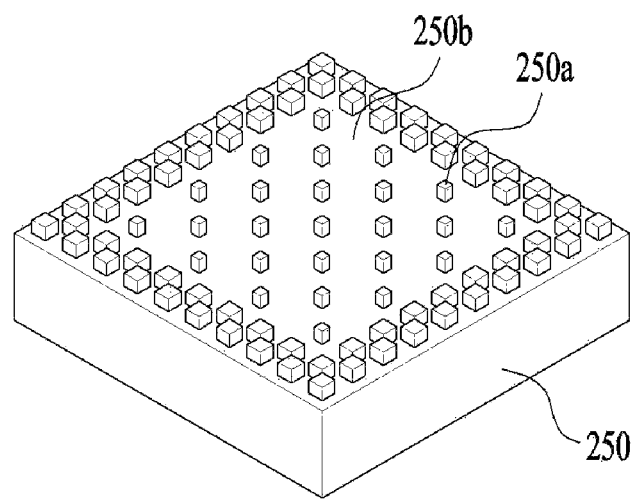
FIG. 6 is a view concretely illustrating a seventh embodiment of the region A of FIG. 2B.

FIG. 6 is a view concretely illustrating a seventh embodiment of the region A of FIG. 2B.

Although the convex portions of the transmissive conductive layer 250 have a circular column shape in the previous embodiments, the cross-sections of the concave and convex portions in a direction parallel to the light emitting surface of the active layer may have a circular or polygonal shape. Here, the light emitting surface may be a boundary surface between the active layer 224 and the first conductivity type semiconductor layer 222 or the boundary surface between the active layer 224 and the second conductivity type layer 226.

As illustrated in FIG. 6, the convex portions may have a regular hexahedral shape. Of course, the shapes of the concave and convex portions are not limited to the above-described shapes.

Figure 7:
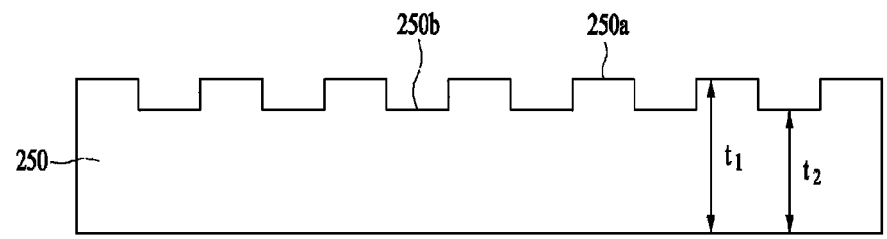
FIG. 7 is a view concretely illustrating an eighth embodiment of the region A of FIG. 2B.

FIG. 7 is a view concretely illustrating an eighth embodiment of the region A of FIG. 2B.

The transmissive conductive layer may have different thicknesses, namely, first and second thicknesses t1 and t2, in first and second regions thereof, respectively. As illustrated in FIG. 7, the first thickness t1 may be greater than the second thickness t2.

In addition, the first thickness t1 may be greater in the edge region than in the central region, and may gradually increase in a direction from the central region of the transmissive conductive layer 250 to the edge region of the transmissive conductive layer 250.

Although the density of the convex portions in the uneven structure of the transmissive conductive layer 250 is greater in the edge region than in the central region in the previous embodiments, no convex portion may be formed in the central region and, as such, the uneven structure is formed only in the edge region.

Figure 8:
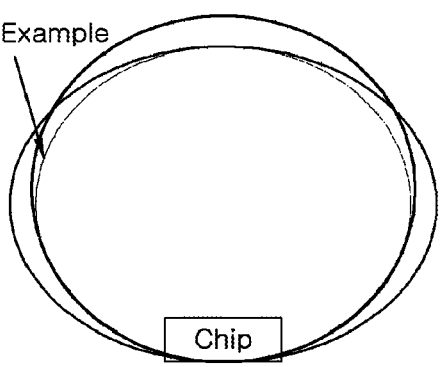
FIG. 8 is a diagram illustrating orientation angles in the light emitting devices according to the embodiments, together with an orientation angle in a comparative example.

In the light emitting device according to each embodiment, the uneven structure formed at the surface of the substrate has a higher density or a greater convex portion size in the edge region of the transmissive conductive layer. Accordingly, light emitted from the light emitting structure is refracted at a higher refraction angle in the edge region of the transmissive conductive layer. As a result, spreading of light emitted from the light emitting device toward a peripheral side is increased and, as such, widening of an orientation angle may be achieved, as compared to a comparative example, as indicated in red in FIG. 8.

In addition, if necessary, the uneven structure formed at the surface of the transmissive conductive layer may be present only in the central region of the transmissive conductive layer, or may have an increased density in the central region of the transmissive conductive layer. In this case, accordingly, light emitted from the light emitting structure is refracted at a higher refraction angle in the central region of the transmissive conductive layer. As a result, although narrowing of an orientation angle may occur, an enhancement in light output power may be achieved, as compared to a comparative example, as indicated in blue in FIG. 8.

Figure 9:
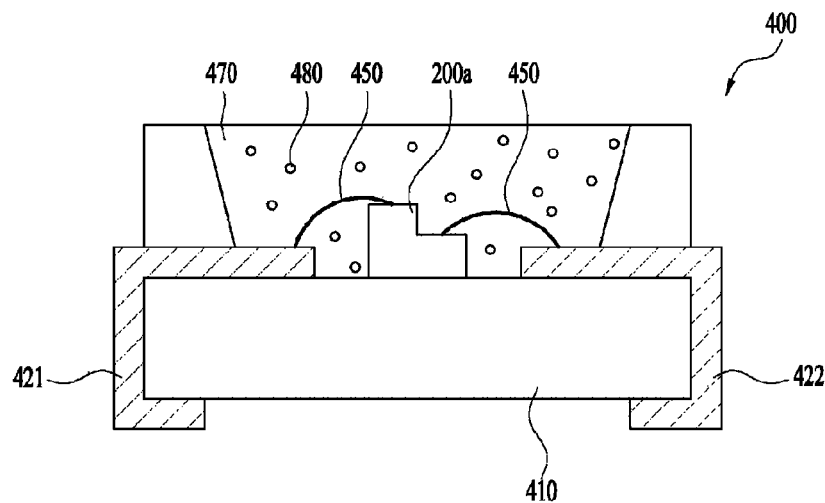
FIG. 9 is a view illustrating an embodiment of a light emitting device package including a light emitting device.

FIG. 9 is a view illustrating an embodiment of a light emitting device package including a light emitting device.

The light emitting device package according to the illustrated embodiment, namely, a light emitting device package 400, includes a body 410 including a cavity, first and second lead frames 421 and 422 mounted to the body 410, a light emitting device 200a according to one of the above-described embodiments, which is mounted on the body 410 while being electrically connected to the first and second lead frames 421 and 422, and a mold 470 formed in the cavity.

The body 410 may be made of a silicon material, a synthetic resin material, or a metal material. When the body 410 is made of a conductive material, for example, a metal material or the like, an insulating layer is coated over the surface of the body 410, to prevent an electrical short circuit between the first and second frames 421 and 422.

The first and second lead frames 421 and 422 are electrically isolated from each other, and supply current to the light emitting device 200a. The first and second lead frames 421 and 422 may reflect light generated from the light emitting device 200a, thereby achieving an enhancement in luminous efficiency. The first and second lead frames 421 and 422 may also dissipate heat generated from the light emitting device 200a to outside.

The light emitting device 200a may be the light emitting device according to one of the above-described embodiments.

The light emitting device 200a may be fixed to the first lead frame 421 by a conductive paste (not shown) or the like, and may be bonded to the second lead frame 422 by wires 450.

The mold 470 may enclose the light emitting device 200a, to protect the light emitting device 200a. In addition, fluorescent substances 480 may be included in the mold 470. In this structure, the fluorescent substances 480 are distributed in the mold 470 and, as such, may vary the wavelength of light emitted from the light emitting device 200a throughout all light emission areas of the light emitting device package 400.

The light emitting device package 400 may carry a single light emitting device or a plurality of light emitting devices, which has a configuration according to one of the above-described embodiments, but the present disclosure is not limited thereto.

Hereinafter, an image display apparatus and a lighting apparatus as embodiments of a lighting system, in which the above-described light emitting device package is arranged, will be described.

Figure 10:
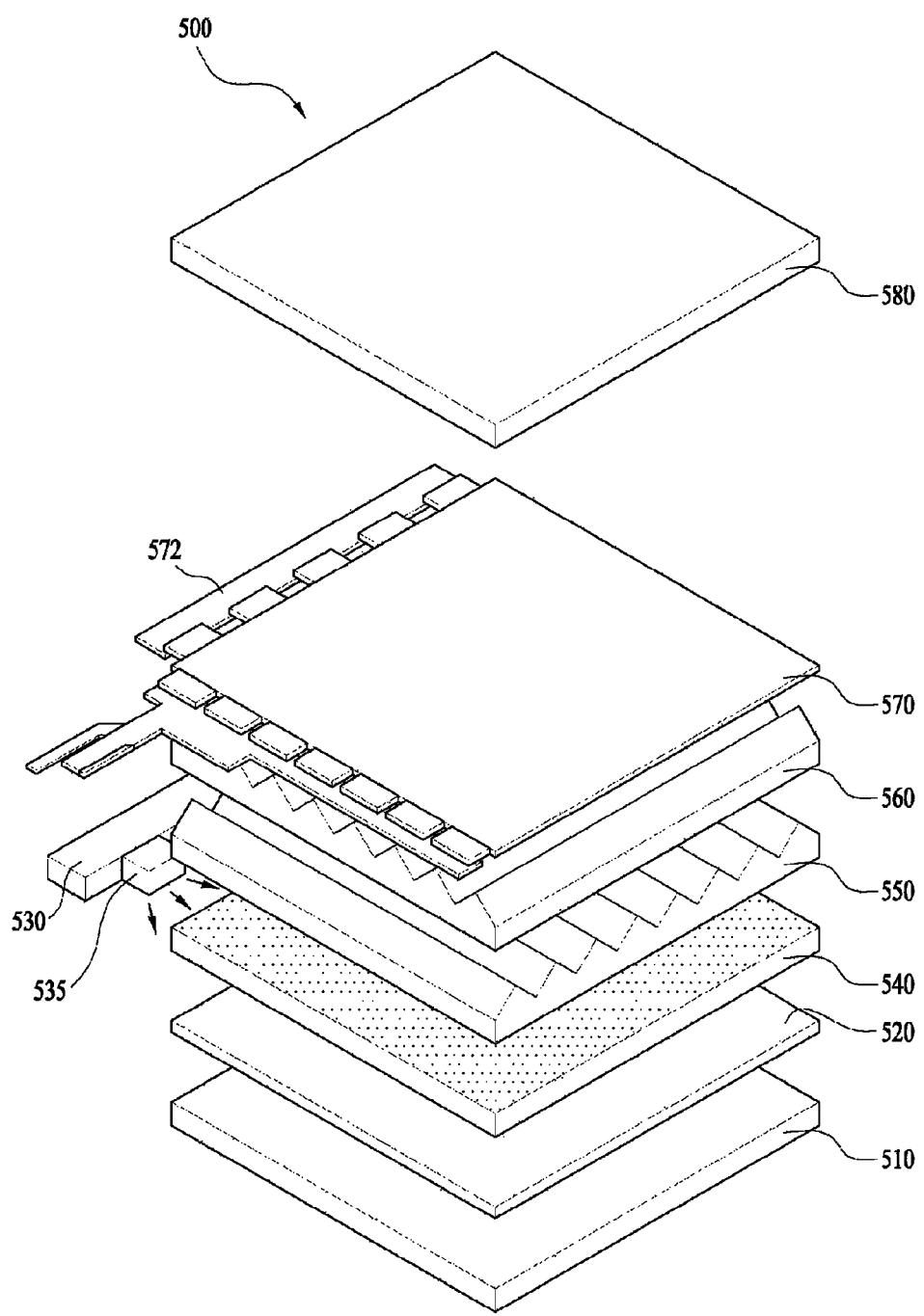
FIG. 10 is a view illustrating an embodiment of an image display apparatus in which light emitting devices are arranged.

FIG. 10 is a view illustrating an embodiment of an image display apparatus in which light emitting devices are arranged.

As illustrated in FIG. 10, the image display apparatus according to the illustrated embodiment, namely, an image display apparatus 500, includes a light source module, a reflective plate 820 provided on a bottom cover 510, a light guide plate 540 disposed in front of the reflective plate 520 to guide light emitted from the light source module to a front side of the image display apparatus 500, first and second prism sheets 550 and 560 disposed in front of the light guide plate 540, a panel 570 disposed in front of the second prism sheet 560, and a color filter 580 disposed in front of the panel 570.

The light source module includes a circuit board 530 and light emitting device packages 535 mounted on the circuit board 530. Here, a printed circuit board (PCB) may be used as the circuit board 530. The light emitting device packages 535 may have the above-described configuration.

The bottom cover 510 may receive the constituent elements of the image display apparatus 500. The reflective plate 520 may be provided as a separate element, as shown in FIG. 10, or may be provided as a material having high reflectivity, which is coated over a rear surface of the light guide plate 540 or a front surface of the bottom cover 510.

The reflective plate 520 may be made of a material having high reflectivity and capable of being formed into an ultra thin structure. Polyethylene terephthalate (PET) may be used for the reflective plate 520.

The light guide plate 540 serves to scatter light emitted from the light source module so as to uniformly distribute the light throughout all areas of a liquid crystal display apparatus. Therefore, the light guide plate 540 may be made of a material having high refractivity and transmissivity. The material of the light guide plate 540 may include polymethylmethacrylate (PMMA), polycarbonate (PC), polyethylene (PE), or the like. The light guide plate 540 may be dispensed with. In this case, the image display apparatus may be implemented as an air guide type image display apparatus.

The first prism sheet 550 may be formed by coating a polymer exhibiting light transmittance and elasticity over one surface of a base film. The first prism sheet 850 may include a prism layer having a plurality of three-dimensional structures in the form of a repeated pattern. Here, the pattern may be of a stripe type in which ridges and valleys are repeated.

The second prism sheet 560 may have a similar structure to the first prism sheet 550. The second prism sheet 560 may be configured such that the orientation direction of ridges and valleys formed on one surface of the base film of the second prism sheet 560 is perpendicular to the orientation direction of the ridges and valleys formed on one surface of the base film of the first prism sheet 550. Such a configuration serves to uniformly distribute light transmitted from the light source module and the reflective sheet 520 toward all areas of the panel 570.

In this embodiment, an optical sheet may be constituted by the first prism sheet 550 and second prism sheet 560. However, the optical sheet may include other combinations, for example, a microlens array, a combination of a diffusion sheet and a microlens array, and a combination of a prism sheet and a microlens array.

A liquid crystal display panel may be used as the panel 570. Further, instead of the liquid crystal display panel 570, other kinds of display devices requiring light sources may be provided.

The panel 570 is configured such that liquid crystals are located between glass bodies, and polarizing plates are mounted on both glass bodies so as to utilize polarizing properties of light. Here, the liquid crystals have properties between a liquid and a solid. That is, the liquid crystals, which are organic molecules having fluidity like the liquid, are regularly oriented, and display an image using change of such molecular orientation due to an external electric field.

The liquid crystal display panel used in the display apparatus is of an active matrix type, and uses transistors as switches to adjust voltage applied to each pixel.

The color filter 580 is provided on the front surface of the panel 570, and transmits only a red, green, or blue light component of light projected from the panel 870 per pixel, thereby displaying an image.

Figure 11:
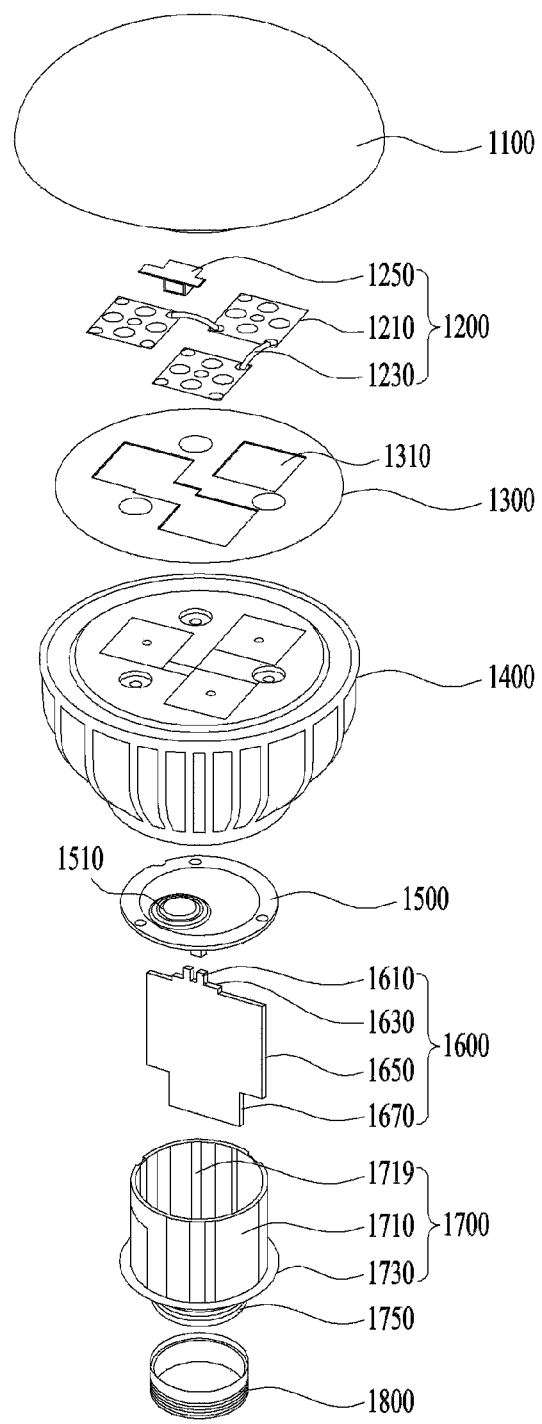
FIG. 11 is a view illustrating an embodiment of a lighting apparatus in which light emitting devices are arranged.

FIG. 11 is a view illustrating an embodiment of a lighting apparatus in which light emitting devices are arranged.

The lighting apparatus according to this embodiment may include a cover 1100, a light source module 1200, a radiator 1400, a power supply 1600, an inner case 1700, and a socket 1800. The lighting apparatus according to this embodiment may further include at least one of a support member 1300 and a holder 1500. The light source module 1200 may include light emitting device packages according to one of the above-described embodiments.

The cover 1100 may have a hollow bulb or hemispherical structure open at a portion thereof. The cover 1100 may be optically coupled to the light source module 1200. For example, the cover 1100 may diffuse, scatter, or excite light supplied from the light source module 1200. The cover 1100 may be a kind of optical member. The cover 1100 may be coupled to the radiator 1400. The cover 1100 may have a coupling portion to be coupled to the radiator 1400.

A milk-white paint may be coated over an inner surface of the cover 1100. The milk-white paint may include a diffusion agent for diffusing light. The inner surface of the cover 1100 may have greater surface roughness than an outer surface of the cover 1100. In this case, accordingly, it may be possible to emit light from the light source module 1200 outwards after being sufficiently scattered and diffused.

The cover 1100 may be made of glass, plastic, polypropylene (PP), polyethylene (PE), polycarbonate (PC) or the like. Polycarbonate exhibits excellent light resistance, heat resistance and strength. The cover 1100 may be transparent to allow the light source module 1200 to be viewed from outside. Alternatively, the cover 12100 may be opaque. The cover 1100 may be formed through blow molding.

The light source module 1200 may be disposed on one surface of the radiator 1400. Accordingly, heat from the light source module 1200 is transferred to the radiator 1400. The light source module 1200 may include a light emitting device package 1210, a connecting plate 1230, and a connector 1250.

The support member 1300 is disposed on the radiator 1400. The support member 1300 is provided with guide holes 1310 for receiving a plurality of light emitting device packages 1210 and the connector 1250. The guide holes 1310 correspond to the substrates of the light emitting device packages 1210 and the connector 1250, respectively.

Surfaces of the support member 1300 may be coated with a light reflective material. For example, the surfaces of the support member 1300 may be coated with a white paint. The support member 1300 receives light returning toward the light source module 1200 after being reflected from the inner surface of the cover 1100, and again reflects the received light toward the cover 1100. Accordingly, the support member 1300 enhances luminous efficiency of the lighting apparatus according to the illustrated embodiment.

The support member 1300 may be made of, for example, an insulating material. The connecting plate 1230 of the light source module 1200 may include a material having electrical conductivity. Accordingly, electrical contact may be provided between the radiator 1400 and the connecting plate 1230. When the support member 1300 is made of an insulating material, the support member 1300 may prevent electrical short circuit between the connecting plate 1230 and the radiator 1400. The radiator 1400 receives heat from the light source module 1200 and heat from the power supply 1600, and dissipates the received heat.

The holder 1500 closes a receiving hole 1719 provided at an insulating portion 1710 of the inner case 1700. Accordingly, the power supply 1600, which is received in the insulating portion 1710 of the inner case 1700, is sealed. The holder 1500 has a guide protrusion 1510. The guide protrusion 1510 may be provided with a hole, through which a protrusion 1610 of the power supply 1600 extends.

The power supply 1600 supplies an electrical signal received from outside to the light source module 1200 after processing or converting the received electrical signal. The power supply 1600 is received in the receiving hole 1719 of the inner case 1700, and is sealed in the inner case 1700 by the holder 1500. The power supply 1600 may include a protrusion 1610, a guide 1630, a base 1650, and a protrusion 1670.

The guide 1630 has a shape protruding outwards from one side of the base 1650. The guide 1630 may be inserted into the holder 1500. A plurality of elements may be disposed on one surface of the base 1650. The elements may include an AC-DC converter for converting AC power supplied from an external power source into DC power, a drive chip for controlling driving of the light source module 1200, an electrostatic discharge (ESD) protecting device for protecting the light source module 1200, etc., but the present disclosure is not limited thereto.

The protrusion 1670 has a shape protruding outwards from the other side of the base 1650. The protrusion 1670 is inserted into a connecting portion 1750 of the inner case 1700, to receive an electrical signal from outside. For example, the protrusion 1670 may have a width equal to or less than the connecting portion 1750 of the inner case 1700. One end of a positive electrical wire and one end of a negative electrical wire may be electrically connected to the protrusion 1670. The other end of the positive electrical wire and the other end of the negative electrical wire may be electrically connected to the socket 1800.

The inner case 1700 may include a mold received therein together with the power supply 1600. The mold is formed as a molding solution is solidified. The mold functions to maintain the power supply 1600 within the inner case 1700 in a fixed state.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

MODE FOR INVENTION

Various embodiments have been described in the best mode for carrying out the invention.

INDUSTRIAL APPLICABILITY

The above-described light emitting device package is applicable to various fields. For example, the light emitting device package is applicable to a lighting apparatus. For example, the lighting apparatus may include at least one of a backlight unit, a lighting unit, an indicator, a lamp and a street lamp.

The invention claimed is:

1. A light emitting device comprising:
    a substrate;
    a light emitting structure disposed on the substrate, the light emitting structure comprising a first conductivity type semiconductor layer, an active layer, and a second conductivity type semiconductor layer;
    a transmissive conductive layer disposed on the second conductivity type semiconductor layer; and
    first and second electrodes respectively electrically connected to the first conductivity type semiconductor layer and the second conductivity type semiconductor layer,
    wherein the transmissive conductive layer is formed with concave and convex portions at a surface thereof directed to the second conductivity type semiconductor layer, and the concave and convex portions have a greater density in an edge region of the transmissive conductive layer than in a central region of the transmissive conductive layer, and
    wherein the concave and convex portions have greater sizes in the edge region of the transmissive conductive layer than in the central region of the transmissive conductive layer.

2. The light emitting device according to claim 1, wherein the concave and convex portions have sizes gradually increasing in a direction from the central region of the transmissive conductive layer to the edge region of the transmissive conductive layer.

3. The light emitting device according to claim 1, wherein the numbers of the concave and convex portions per unit area are greater in the edge region of the transmissive conductive layer than in the central region of the transmissive conductive layer.

4. The light emitting device according to claim 3, wherein the numbers of the concave and convex portions per unit area gradually increase in a direction from the central region of the transmissive conductive layer to the edge region of the transmissive conductive layer.

5. The light emitting device according to claim 1, wherein the distance between the concave portions and the distance between the convex portions are smaller in the edge region of the transmissive conductive layer than in the central region of the transmissive conductive layer.

6. The light emitting device according to claim 5, wherein the distance between the concave portions and the distance between the convex portions gradually decrease in a direction from the central region of the transmissive conductive layer to the edge region of the transmissive conductive layer.

7. The light emitting device according to claim 1, wherein the transmissive conductive layer is made of indium tin oxide (ITO).

8. The light emitting device according to claim 1, wherein the second conductivity type semiconductor layer has a surface patterned to have portions having shapes opposite to shapes of the concave and convex portions of the transmissive conductive layer.

9. A light emitting device comprising:
a substrate;
a light emitting structure disposed on the substrate, the light emitting structure comprising a first conductivity type semiconductor layer, an active layer, and a second conductivity type semiconductor layer;
a transmissive conductive layer disposed on the second conductivity type semiconductor layer; and
first and second electrodes respectively electrically connected to the first conductivity type semiconductor layer and the second conductivity type semiconductor layer,
wherein the transmissive conductive layer is formed with concave and convex portions at a surface thereof opposing the second conductivity type semiconductor layer, and the concave and convex portions have a greater density in an edge region of the transmissive conductive layer than in a central region of the transmissive conductive layer, and
wherein the concave and convex portions have greater sizes in the edge region of the transmissive conductive layer than in the central region of the transmissive conductive layer.

10. The light emitting device according to claim 9, wherein the concave and convex portions have sizes gradually increasing in a direction from the central region of the transmissive conductive layer to the edge region of the transmissive conductive layer.

11. The light emitting device according to claim 9, wherein the numbers of the concave and convex portions per unit area are greater in the edge region of the transmissive conductive layer than in the central region of the transmissive conductive layer.

12. The light emitting device according to claim 11, wherein the numbers of the concave and convex portions per unit area gradually increase in a direction from the central region of the transmissive conductive layer to the edge region of the transmissive conductive layer.

13. The light emitting device according to claim 9, wherein the distance between the concave portions and the distance between the convex portions are smaller in the edge region of the transmissive conductive layer than in the central region of the transmissive conductive layer.

14. The light emitting device according to claim 13, wherein the distance between the concave portions and the distance between the convex portions gradually decrease in a direction from the central region of the transmissive conductive layer to the edge region of the transmissive conductive layer.

15. The light emitting device according to claim 9, wherein the transmissive conductive layer is made of indium tin oxide (ITO).

16. The light emitting device according to claim 9, wherein the second conductivity type semiconductor layer is disposed on the transmissive conductive layer, and the second conductivity type semiconductor layer has a surface patterned to have portions having shapes opposite to shapes of the concave and convex portions of the transmissive conductive layer.

17. The light emitting device according to claim 9, wherein cross-sections of the concave and convex portions in a direction parallel to a light emitting surface of the active layer have a circular or polygonal shape.

18. A light emitting device comprising:
a substrate;
a light emitting structure disposed on the substrate, the light emitting structure comprising a first conductivity type semiconductor layer, an active layer, and a second conductivity type semiconductor layer; and
a transmissive conductive layer disposed on the second conductivity type semiconductor layer,
wherein the transmissive conductive layer has concave and convex portions disposed on a first surface directed to the second conductivity type semiconductor layer and a second surface opposing the first surface respectively, and
wherein a density of the concave and convex portions on the first surface is different from a density of the concave and convex portions on the second surface.

* * * * *